United States Patent [19]

Wu

[11] Patent Number: 4,584,761

[45] Date of Patent: Apr. 29, 1986

[54] INTEGRATED CIRCUIT CHIP PROCESSING TECHNIQUES AND INTEGRATED CHIP PRODUCED THEREBY

[75] Inventor: Andrew L. Wu, Shrewsbury, Mass.

[73] Assignee: Digital Equipment Corporation, Maynard, Mass.

[21] Appl. No.: 610,337

[22] Filed: May 15, 1984

[51] Int. Cl.[4] ............................................. H01L 21/76
[52] U.S. Cl. ................................ 29/571; 29/576 W; 29/577 C; 29/578; 29/579; 29/590; 148/1.5; 148/DIG. 105
[58] Field of Search ................. 29/571, 576 W, 577 C, 29/578, 579, 590, 591; 148/1.5, DIG. 105; 156/643, 646, 659, 660, 661.1; 357/23 CS, 41

[56] References Cited

U.S. PATENT DOCUMENTS

| | | |
|---|---|---|
| 3,985,597 | 5/1975 | Zielinski . |
| 4,114,255 | 9/1978 | Salsbury et al. ...................... 29/578 |
| 4,123,565 | 10/1978 | Sumitomo et al. .................... 29/578 |
| 4,139,402 | 2/1979 | Steinmaier et al. .................... 29/578 |
| 4,192,059 | 3/1980 | Khan et al. ............................. 29/571 |
| 4,219,379 | 8/1980 | Athawas ................................ 29/571 |
| 4,266,985 | 5/1981 | Ito et al. ................................. 29/571 |
| 4,322,883 | 4/1982 | Abbas et al. ........................... 29/578 |
| 4,360,823 | 11/1982 | van Gils . |
| 4,367,119 | 8/1980 | Logan et al. . |
| 4,424,621 | 1/1984 | Abbas et al. ........................... 29/578 |
| 4,441,941 | 4/1984 | Nozawa ................................. 29/578 |

OTHER PUBLICATIONS

L. B. Rothman, "Process for Forming Passivated Metal Interconnection System with a Planar Surface", *J. Electrochemical Society: Solid–State Science and Technology*, vol. 130, No. 5, May 1983, pp. 1131–1136.

*Primary Examiner*—Brian E. Hearn
*Assistant Examiner*—Hunter L. Auyang
*Attorney, Agent, or Firm*—Cesari and McKenna

[57] ABSTRACT

A method of fabricating an integrated circuit chip including insulated gate field effect transistors, and an integrated circuit chip produced thereby. By a series of complementary self-aligned masking operations, the field oxide is produced from an initial oxide layer to define active device regions in which transistors are formed, and field implants are provided only in the field regions under the field oxide. The transistors are then formed so that the level of the top surface of the gate electrodes corresponds to the level of the top surface of the field oxide. An insulation layer is applied to the sidewalls of the gate electrodes and conductive material is deposited in the recess defined by the gate electrodes and the field oxide. The level of the top surface of the conductive material corresponds to the level of the top surface of the gate electrodes and field oxide. An insulation layer is then applied to the chip surface. In another aspect, a recess may be formed in the chip under a photoresist layer such that the photoresist overhangs the resist. A metal film is cold-sputtered, filling the recess and covering the photoresist. The film in the recess is separated from the film covering the recess because of the overhang. A second photoresist layer is applied, then etched to expose a corner of the metal film over the overhang. The metal is etched to expose the underlying photoresist, and the underlying photoresist, and the portion of the second layer over the film in the recess, are removed.

29 Claims, 18 Drawing Figures

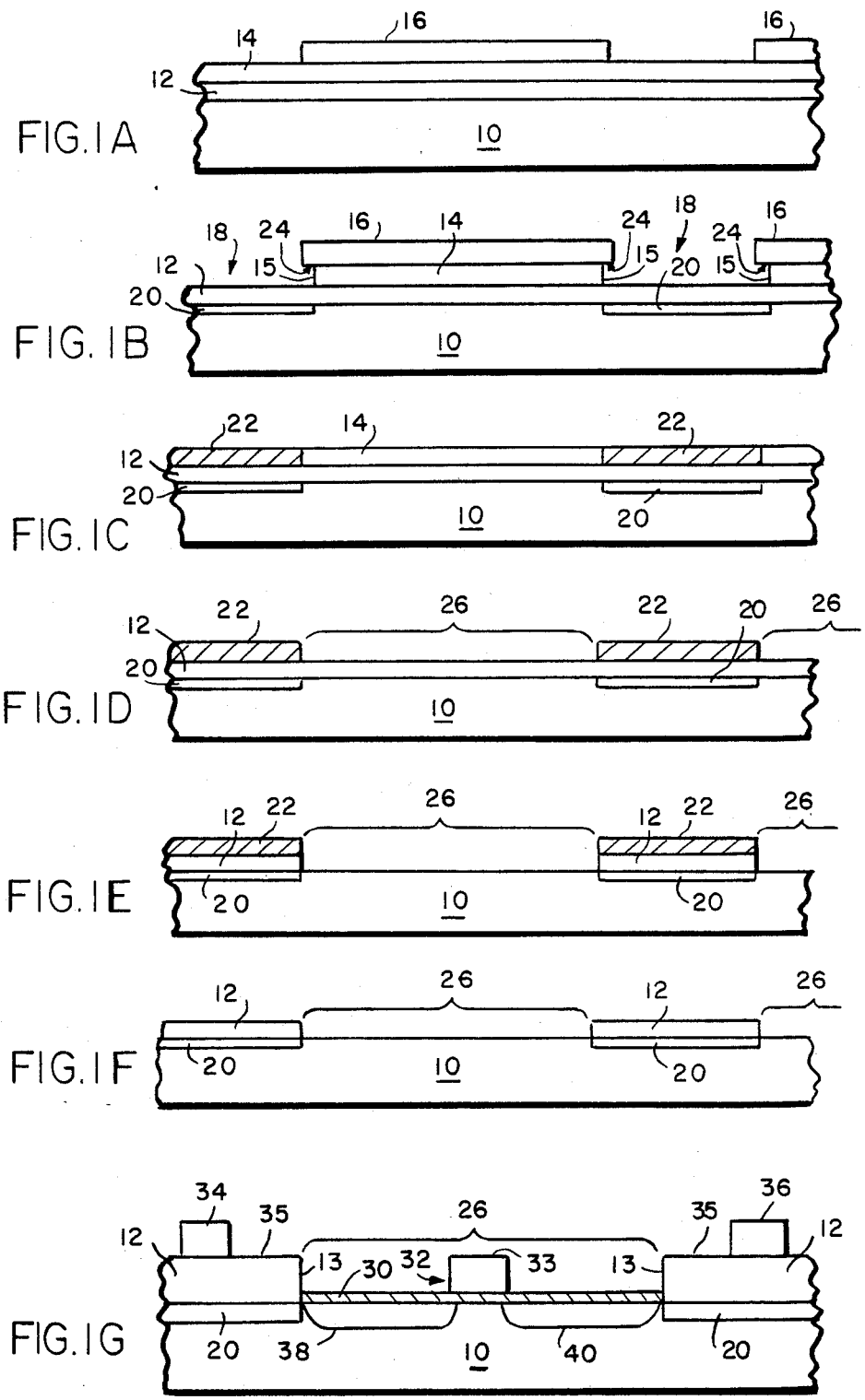

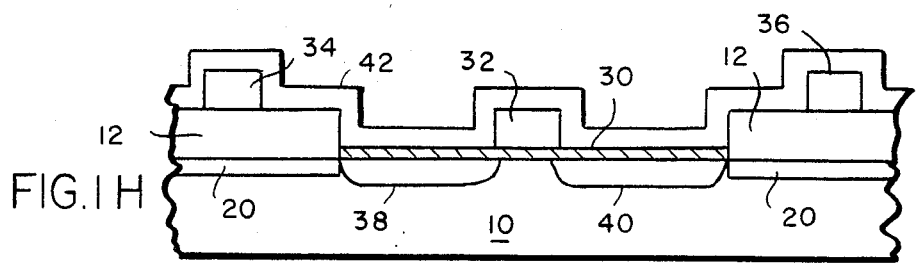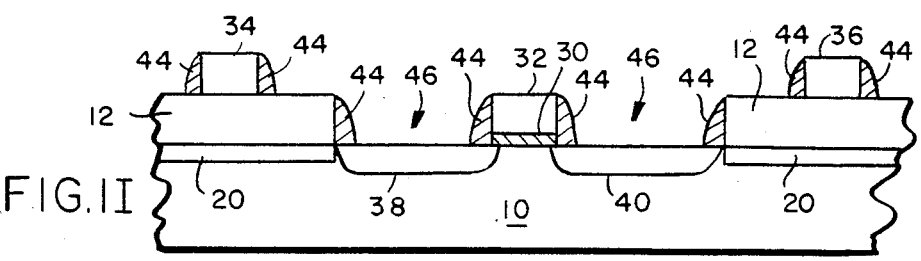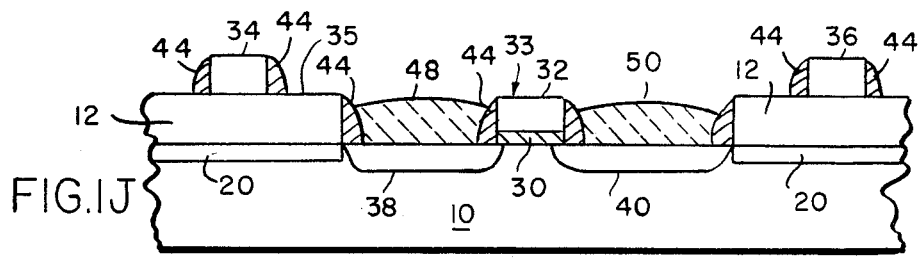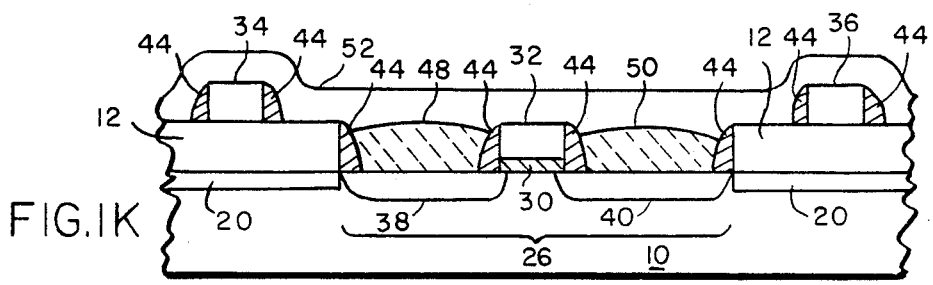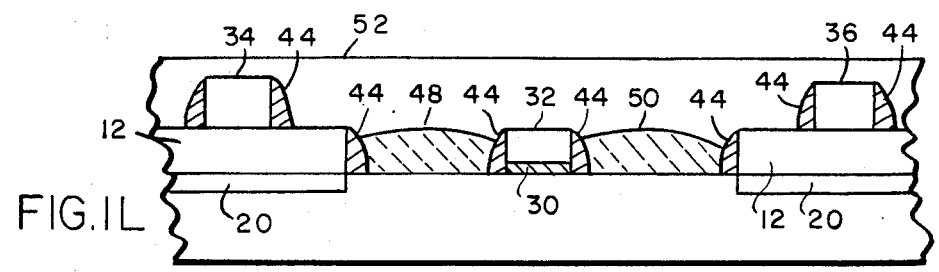

INTEGRATED CIRCUIT CHIP PROCESSING TECHNIQUES AND INTEGRATED CHIP PRODUCED THEREBY

BACKGROUND OF THE INVENTION

1. Field of the Invention

The invention relates generally to the field of methods for fabricating integrated circuit chips using MOSFET (metal oxide semiconductor field effect transistor) technology or, more generally, insulated gate field effect transistor integrated circuit chips and to integrated circuit chips produced thereby.

2. Description of the Prior Art

The process of manufacturing an MOSFET or IGFET integrated circuit chip can be generally divided into two general sequences of steps. First, the active areas are defined on the substrate by growing or depositing field oxide insulation in the areas of the substrate surrounding the active device areas, that is, the areas of the chip on which the active components such as transistors are to be fabricated. These active areas are left free of the oxide insulation layer. Typically, a field implant is provided under the field oxide to eliminate surface inversion problems in the substrate. During the second portion of the semi-conductor processing, the circuit components, that is, the transistors and other circuit elements, are defined, fabricated and interconnected by metal or polysilicon film strips deposited over the field oxide.

Two general techniques have been used in the first sequence, that is, the field oxide and implant sequence. In one technique, which results in a chip generally described as "non-isoplanar", an ion implant bombards the upper surface to provide a field implant and a layer of oxide is grown over the entire upper surface of the chip at high temperature in a steam atmosphere. The ions, typically boron if the substrate is a P-type substrate, impregnate the entire upper surface of the substrate under the oxide. The active regions are then defined by a photo-resist, and the oxide in the active regions is removed. A compensation implant, which is required to neutralize the portion of the field implant in the active areas, is then deposited in the exposed upper surface of the substrate. With this procedure, the channels of the IGFET transistors will be buried in the substrate, rather than being adjacent the surface. A surface channel IGFET is generally more desirable than a buried channel IGFET. Furthermore, since the field oxide is grown at high temperature, the field implant will expand into the substrate during field oxide growth. Accordingly, the peripheral areas between the field implant and the source and drain regions will be relatively large, resulting in a relatively high peripheral junction capacitance between the sides of the source and drain regions and the field implant, which results in slower operation of the transistors.

The second general technique for providing the field oxide and implant, called the "local oxide" or "LOCOS" process, has been developed which results in a significantly more planar device than the other technique. The local oxide technique results in the upper surface of the field oxide being at or near the same level as the level of the substrate in the active regions. In the local oxide technique, the initial oxide layer is deposited on the entire surface of the substrate, and a silicon nitride layer is deposited thereover. The active regions are then defined by a photo-resist, and the silicon nitride in the field regions outside of the active regions is removed. The field implant is then produced by bombarding the chip surface with boron ions, as in the non-isoplanar technique; however, the silicon nitride and remaining photo-resist in the local oxidation technique shields the substrate from the ions and so the field implant is produced only in the field regions outside of the active regions. The chip is then placed in a steam atmosphere at high temperature and the oxide layer, in the field regions not shielded by the silicon nitride, grows to a desired thickness for the field oxide. The photoresist, nitride, and initial oxide in the active region are then removed.

In the local oxidation technique a surface channel device is produced, but the technique has several other deficiencies. First, since the field oxide is grown from the silicon in the substrate, the field region's thickness expands, while the active region does not. Accordingly, crystalline defects can result in the substrate which can result in device failure.

Furthermore, the silicon nitride can react with the silicon substrate under the edges of the initial oxide in the active regions, resulting in a "white ribbon" effect. In that reaction, the silicon nitride coating breaks down and the nitrogen therefrom reacts with the silicon in the silicon substrate along the edges of the initial oxide layer. All around the initial oxide layer, the underlying substrate, when the oxide is removed, exhibits a silicon nitride ribbon around the periphery of the device region, which, in turn, can result in failures in the gate oxide, such as ruptures at lower voltages than otherwise. Furthermore, as in the non-isoplanar technique, the high temperatures used in the field oxide growth step results in a deeper field implant, which, in turn, results in an increase in the peripheral area between the field implant and the source and drain regions, thereby causing an increased peripheral junction capacitance therebetween, which can, in turn result in a slower device operation.

Finally, the growth of the field oxide in the local oxidation technique also results in a horizontal encroachment of the field oxide into the active region. Thus, with this procedure, it is difficult to maintain accurate control over the width of the active device regions.

After the gate oxide insulation and gate electrode are formed on the surface of the substrate the source and drain regions of the active devices have been formed and the interconnections deposited. Generally, the interconnections are patterns of a polysilicon or metal film deposited on the field oxide and placed in physical and electrical contact with the source and drain regions and the other interconnecting lines. A problem may result, however, if metal is used to form the interconnects, since metal has poor step coverage over sharp corners which may be present. Therefore, it is desirable to have as planar a device as possible before the metal film is deposited. Since the top surface of the field oxide is generally at a much higher elevation than, for example, the surface of the source and drain regions, particularly in a non-isoplanar chip, it is apparent that connection problems may result during the formation of interconnections.

In view of the problems inherent in connecting the source and drain regions to the metal interconnection pattern over inclined surfaces and over corners on, for example, the field oxide, methods have been developed, exemplified in U.S. patent application Ser. No. 505,046 filed June 16, 1983, by the present inventor and assigned to the assignee of the present application, in which a chip, after the source and drain regions and the gate electrode are provided, is covered with an insulation layer which supports the interconnect pattern. Apertures are etched in the insulation layer to the source and drain regions and the polysilicon interconnects and filled with a conductive material. The metal interconnection pattern is then formed. If multiple interconnection layers are required, the process is repeated. However, since the level of the upper surfaces of the polysilicon interconnects are much higher than the level of the upper surface of the source and drain regions, the etching will expose the polysilicon interconnects before it exposes the source and drain regions, and the extra time required to expose the source and drain regions may result in damage to the polysilicon interconnects.

It often becomes necessary in the processing of an integrated circuit chip to fill in a recess in, for example, a dielectric such as an oxide layer with a metal conductor material. In the aforementioned U.S. patent application Ser. No. 505,046, a technique is described for performing this operation. In brief, a metal film is deposited by the surface of the chip. The depth of the film is sufficient to at least fill the recess in the dielectric and leave a recess in the upper surface of the metal film. A photoresist coating is applied over the metal film to fill the recess in the metal film and provide a planar upper surface. The photoresist coating is etched by reactive ion etching techniques, leaving the photoresist in the recess in the metal film. A metal etch is then applied, which removes the metal outside the recess. The remaining photoresist is then removed, leaving the metal in the recess. This technique is generally limited to filling recesses having widths of ten microns or less, on chips in which the recesses are of uniform widths. Thus, if the recesses are of significantly diverse widths or if they have widths of greater than about ten microns, the process described in the above-mentioned patent application may not provide satisfactory filling of the recesses.

SUMMARY OF THE INVENTION

The invention aims to provide a new and improved method of fabricating a metal-oxide-semiconductor or, more generally, an insulated gate, field effect transistor integrated circuit chip and to provide an integrated circuit chip produced thereby.

In one aspect, the invention provides a new method of defining the active regions in which active circuit elements such as transistors are to be formed in later processing steps. The new method produces a non-isoplanar device, which eliminates the problems associated with the local oxidation techniques, and also produces a surface channel device, eliminating that problem of current non-isoplanar devices. In the new method, an insulation layer, such as silicon dioxide or "oxide" having the thickness required for the field oxide, is deposited over the entire substrate. A polysilicon layer is then deposited on top of the oxide layer. A photoresist layer is deposited over the upper surface of the polysilicon layer and patterned to define the active regions in a known manner. The photoresist pattern process leaves photoresist covering the active regions and exposes the upper surface of the polysilicon layer in the field regions outside the active regions. The polysilicon in the field regions is removed and a field implant is applied through the oxide. The photoresist and polysilicon prevent the implant from being applied in the active regions, and so the field implant will be formed only in the field regions. Thus, the device formed by this method will be a surface channel device.

The remaining polysilicon over the active regions defines recesses which are filled with a metal film using the technique described below. In that process, the photoresist layer in the field region is removed. The pattern of metal film over the surface of the chip defines the field regions of the chip. The exposed oxide layer in the areas are not covered by the metal film is then removed to define the device regions.

In a further aspect of the invention, after the active circuit devices are formed on the substrate, a new sequence of processing steps provides a relatively planar upper chip surface to facilitate contact to a metalization pattern deposited later. In the new sequence, the gate electrode is formed so that the level of its upper surface is at the same level as the upper surface of the field oxide. An insulating layer is then applied to the sidewalls of the gate electrode. The insulating layer on the gate electrode, and the sidewalls of the field oxide bordering the source and drain regions, form recesses which are filled with a conductive layer, the level of the top surface of which corresponds to the level of the top surface of the gate electrode and the field oxide. The conductive layers are insulated from the gate electrodes by the insulation layers previously applied to the sidewalls of the gate electrodes. The upper surface of the chip is then covered by a insulation layer, which is planarized by reflow techniques, onto which the metal interconnect pattern is later deposited. Apertures are etched in the insulation layer allowing connection of the metal interconnects to the polysilicon interconnects and the conductive material overlying the source and drain regions. Since the depth differential through the insulation layer to the polysilicon interconnects and conductive material over the source and drain regions is significantly reduced by the provision of the conductive material, the potential damage to the polysilicon interconnects will be significantly reduced during the etching process.

A further aspect of the invention provides a new and improved method of filling a recess in a dielectric with a metal film. The region of the dielectric in which the recess is to be formed is defined by a photoresist, and the region is etched so that the photoresist overhangs the recess slightly. A metal film is then cold sputtered over the entire surface of at least the recess and surrounding photoresist to fill the recess. In this condition, the metal also covers the top of the photoresist and the sidewall thereof bordering the overhang. The metal covering the sidewall of the photoresist is separated from the metal deposited in the recess. The surface of the metal is then covered by a layer of, for example photoresist, which is partially etched away leaving exposed the edge of metal near the corner of the underlying photoresist layer. The exposed metal is then etched away, exposing the corner of the photoresist therebeneath. The lower photoresist layer is then removed, which also removes the covering metal and upper photoresist layer. Simultaneously, the photoresist covering the metal in the recess is removed.

BRIEF DESCRIPTION OF THE DRAWINGS

This invention is pointed out with particularity in the appended claims. The above and further advantages of this invention may be better understood by referring to the following detailed description taken in conjunction with the accompanying drawings in which:

FIGS. 1A through 1L are cross-sectional views of an integrated circuit chip in various stages of the inventive fabrication process, useful in understanding of the process and of the structure of the integrated circuit chip constructed in accordance with the first two aspects of the invention.

DETAILED DESCRIPTION OF AN ILLUSTRATIVE EMBODIMENT

Figure 2A:
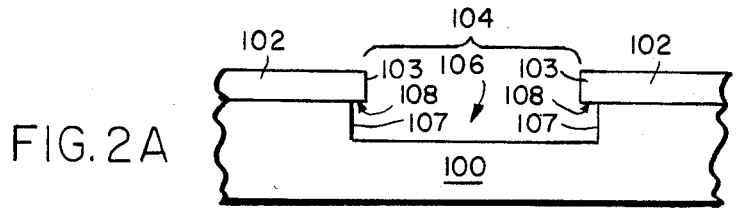
FIGS. 2A through 2F are cross-sectional views detailing the method of filling a recess with a metal film in accordance with the third aspect of the invention.

With reference to the figures, FIGS. 1A through 1F illustrate the processing steps in which the active device regions are defined and FIGS. 1G through 1K illustrate succeeding processing steps in which the active circuit devices, such as insulated gate field effect transistors (IGFETS), are formed to provide a planar chip surface.

With reference to FIG. 1A, and in accordance with one aspect of the invention, a substrate 10 is covered with a base layer 12 of insulation, such as silicon dioxide or "oxide", and a second layer 14 of polysilicon in a conventional manner. The thickness of oxide layer 12 corresponds to the desired thickness of field oxide for the chip. The upper surface of the polysilicon 14 is then coated with a layer of photoresist, which is masked and developed in a conventional manner to leave photoresist layer 16 covering the active regions of the substrate, that is, the areas in which the active devices such as IGFET's will be formed in later processing steps.

With reference to FIG. 1B, using a directional reactive ion etch, the portions of the polysilicon layer 14 which are not covered by photoresist 16 are removed resulting in the formation of recesses 18 defined by the sidewalls 15 of the polysilicon layer and the upper surface of oxide layer 12. With the photoresist 16 and polysilicon 14 as a mask to shield the active device regions, field implants 20 are provided through oxide layer 12. Recesses 18 are then filled with a metal film 22 (FIG. 1C) and the remaining portions of the photoresist layer 16 are removed. The process described below in connection with FIGS. 2A through 2F may be used for this operation. If that process is used, the reactive ion etch step noted above in connection with FIG. 1B is conditioned to provide an overhang 24 of the photoresist 16 over the remaining portion of polysilicon layer 15. The purpose of the overhang will be explained below in connection with FIGS. 2A through 2F.

After the metal film 22 is applied and the remaining portions of photoresist layer 16 are removed (FIG. 1C) the remaining polysilicon layer 14 is removed (FIG. 1D). In one specific embodiment of the invention, a solution of nitric acid, water and hydrofluoric acid is used in a 50:3:1 ratio to remove the polysilicon layer 14 without severe etching of the underlying oxide layer 12. The metal layers 22 are then used as masks through which a directional reactive ion etch removes the portions of the oxide layer 12 in the active device regions generally indicated at 26 (see FIG. 1E). The metal layers 22 are then removed (FIG. 1F), which leaves the substrate 10, with the field oxide 12 and field implant 20 bordering and defining the active device regions 26.

It can be seen in connection with FIGS. 1A through 1F, that the photoresist layer 16 (FIG. 1A), after the development and removal of the portion of the photoresist layer in the field regions, defines the active devices and in successive processing steps are used to enable the field implant (FIG. 1B) to be provided only in the field region. The photoresist layer 16 is then used to provide a metal mask which allows the oxide in the active device regions to be removed. The various layers of photoresist, polysilicon and metal provide self-aligned masks through the processing steps thereby reducing the likelihood of error due to misalignment of externally applied masks in the successive processing steps.

Furthermore, since the photoresist and polysilicon layers shield the active device region during the field implant, no compensation implant is required in the device fabricated according to the process depicted in FIGS. 1A through 1F. The resulting device is thus a surface channel device, unlike the prior devices fabricated according to non-isoplanar techniques.

In addition, since the process does not require the growth of the field oxide, as in the local oxidation technique, it avoids problems associated with that technique, including the crystal deformation and "white ribbon" defects.

With reference to FIGS. 1G through 1K, the second aspect of the invention, which produces a chip having a relatively planar upper surface, will be described. FIG. 1G illustrates one active device region 26 on an integrated circuit chip including substrate 10, the field oxide 12 and field implants 20. In a conventional manner, a thin insulation layer 30 of preferably silicon dioxide is deposited over the surface of substrate 10 in the recess defined by the sidewalls 13 between the relatively thick field oxide segments. A strip of polysilicon is deposited on top of the oxide layer 30 to form a gate electrode 32. At the same time, polysilicon strips 34 and 36 are provided on top of the field oxide 12 as interconnect lines. The upper surface 33 of gate electrode 32 is at about the same level as the upper surface 35 of the field oxide 12. After the gate electrode 32 is formed, implants are formed, in a conventional manner, as the source and drain regions 38 and 40.

The steps depicted in FIGS. 1H and 1I are then used to provide insulation layers on the vertical sidewalls of gate electrode 32. The surface of the chip is first covered with a layer 42 of an insulation material, such as silicon dioxide, which is etched away by a reactive ion etch leaving (see FIG. 1I) an insulation layer 44 on each vertical surface. Thus, the vertical sidewalls of the gate electrode 32 has layers 44 of insulation which extend slightly out and over the source and drain implants 38 and 40. Similarly, insulation layers 44 cover the vertical sidewalls of field oxide 12 which extend over source and drain regions 38 and 40, and the sidewalls of the interconnect lines 34 and 36 are covered with oxide layers 44 also which extend out and over portions of field oxide 12.

With reference to FIG. 1I, it will be noted that the upper surfaces of the source and drain regions 38 and 40, which correspond to the upper surface of the substrate 10, before the addition of the field oxide 12 and gate electrode 32, have a much lower elevation than the upper surface of the gate electrode 32 and field oxide. The oxide layers 44 covering the sidewalls of gate electrode 32 and field oxide 12, then define recesses 46 which are filled with layers 48 and 50 of a conductive material (see FIG. 1J), such that the top levels of the layers are at approximately at the same level as that of the upper surface 33 of the gate electrode 32 and the upper surface 35 of the field oxide 12. Tungsten silicide is preferably used as the conductive material to avoid potential problems of spiking through the shallow source and drain regions to the substrate 10. The process used to deposit conductive layers 48 and 50 is preferably the process described in the aforementioned U.S. patent application Ser. No. 505,046. Metal may be deposited over the entire chip, so that its upper surface is relatively planar in the active device regions, and then etched sufficiently to expose the upper surface of oxide layer 12 and gate electrode 32. In this condition, metal will remain in recesses 46 to form conductive layers 48 and 50.

Next, the chip is coated with a layer 52 of phosphosilicate glass or boro-phospho-silicate glass (FIG. 1K) which is then reflowed to form a relatively planar upper surface (FIG. 1L). It will be appreciated that the differences in the thicknesses of the glass over the polysilicon interconnects 34 and 36 in the field region defined by field oxide 12 and metal layers 48 and 50 in the device region 26 is significantly reduced from the prior art in which the metal layers were not provided. Thus, when the apertures are formed through the glass layer 52 to the polysilicon interconnects and the metal layers, the polysilicon interconnects will not be significantly damaged by the etching process.

This aspect of the invention also provides several other advantages. Providing insulation layers 44 on the sidewalls of gate electrode 32 allows a "lightly doped drain", or "LDD" structure to be easily achieved. In the structure, the portion of the drain region extending under oxide insulation layers 44 on the sidewall of gate electrode 32 is relatively lightly doped, which, in turn, reduces the possibility of electrons moving into and lodging in the gate oxide 30. The movement of the electrons into the gate oxide 30 can deteriorate operation of the transistor by shielding the channel region in the substrate under the oxide layer from the electric field of the gate electrode.

Furthermore, it will be appreciated that filling the entire recesses 46 (FIG. 1I) with conductive layers 48 and 50 reduces the source and drain input and output resistance of the transistor. In addition, the use of the conductive layers 48 and 50 and the oxide layers 44 on the sidewalls of the field oxide 12 allows the elimination of the contact surrounding, and so the transistors can be made smaller, and ensures that the tungsten silicide of layers 48 and 50 will be adequately separated from the field region so that spiking will be avoided. The conductive layers 48 and 50 and the insulation layers 44 on the sidewalls of field oxide layer 12 also allow a self-aligned contact scheme to be used to connect to the interconnect pattern (not shown) deposited on insulation layer 52; that is, these elements allow the apertures through the insulation layer 52 to be displaced slightly from the centers of the source and drain regions and still achieve good contact and adequately avoid spiking problems.

A further aspect of the invention provides a new and improved method of filling a recess with a metal film layer. As noted above, the process described in connection with FIGS. 2A through 2F can be used in filling recesses 18 (FIG. 1B).

With reference to the figures, FIG. 2A depicts an integrated circuit chip having a substrate 100 covered by a layer of photoresist 102. An aperture generally indicated at 104 has been defined in the photoresist layer in a conventional manner and a recess 106 formed in the substrate 100 defined by sidewalls 107. The photoresist thus has a sidewall 103 defining the periphery of the aperture 104. The recess is defined by means of a directional reactive ion etch so as to provide an overhang 108 of the photoresist 102 over the sidewalls 107 defining recess 106.

Figure 2B:
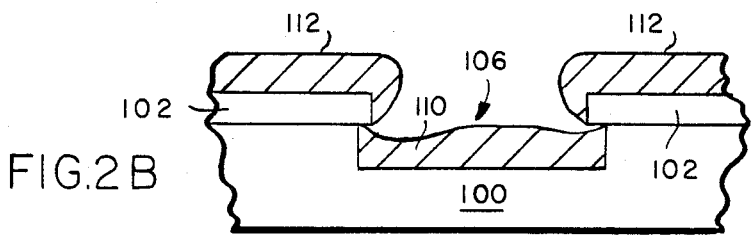

The metal which is desired to fill the recess 106 is then cold-sputtered over the surface of the chip to a depth sufficient to fill the recess 106 (see FIG. 2B). The depth of the metal film 112 over photoresist 102 is approximately the same as the depth in the recess. Near the overhang, as shown in FIG. 2B, the metal covering the photoresist layer curves around the corner defined by sidewall 103 and the top surface of photoresist layer 102. Because of the limited depth of the metal film and the presence of overhang 108, there is a slight concavity in the surface of the film 110 in the recess under the overhang, and so the metal film covering the photoresist does not come in contact with its metal film in the recess.

Figure 2C:
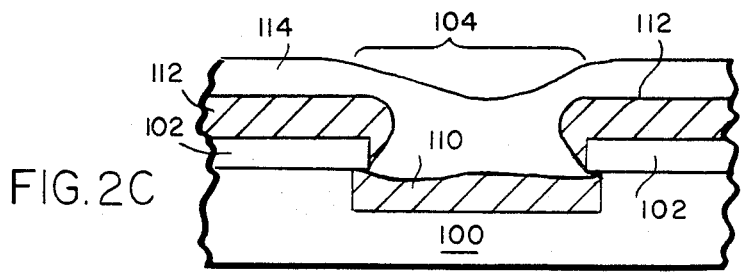
Figure 2D:
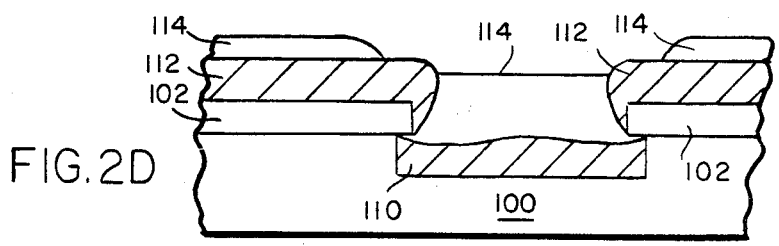
Figure 2E:
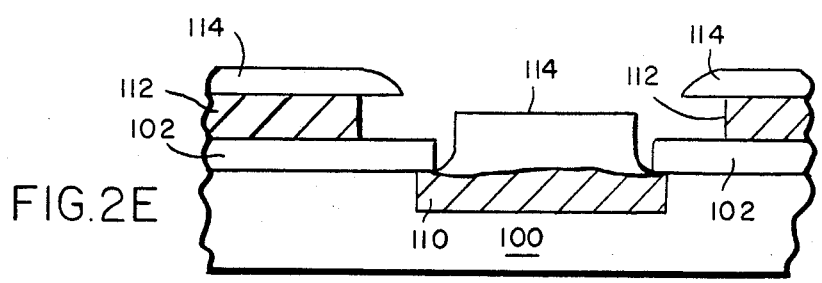
Figure 2F:
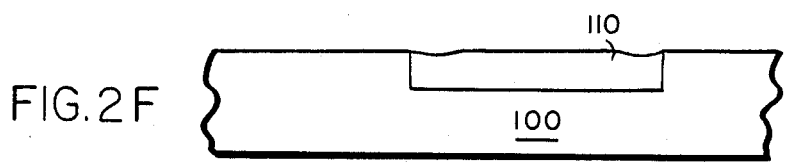

The entire surface of the chip is then covered with a second photoresist layer 114 (FIG. 2C). In the region of the recess 106, the upper surface of the second photoresist layer exhibits a slight concavity so that it is generally thinner in the region near sidewall 103 defining the periphery of aperture 104 than in the rest of the chip. Using a reactive ion etch, a portion of the surface of the photoresist 114 is removed so as to expose the corner of metal film 112 adjacent the periphery of aperture 104 in photoresist layer 102 (FIG. 2D). A wet metal etch is then applied which etches the exposed portions of the metal layer 112 sufficient to expose the photoresist layer 102 therebeneath (FIG. 2E). Since the metal layer 110 in the recess is covered by the remaining photoresist 114 and protected from the wet metal etch by photoresist layer 114 and the overhang 108, the metal layer is 110 is not damaged by the wet metal etch. Finally, the photoresist layer 102 is removed in a conventional manner, taking with it the metal layer 112 and photoresist layer 114 thereover. At the same time, photoresist layer 114 over the metal layer 110 is also removed resulting in the configuration depicted in FIG. 2F.

The foregoing description has been limited to specific embodiments of the various aspects of the invention. It will be apparent, however, that the invention can be practiced in integrated circuit chips having diverse basic construction than is disclosed in the specification, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A method of forming an integrated circuit chip on a substrate of a first conductivity type comprising the steps of:
  A. depositing an insulation layer and a second layer over a surface of the substrate;
  B. defining active device regions and removing portions of the second layer in the field regions to produce windows in the second layer in the field regions;
  C. impregnating the surface of the substrate in the field regions with an implant having the first conductivity type to provide a field implant;
  D. depositing a masking material in the windows in the second layer to provide a mask defining the field regions;

E. removing the remainder of the second layer and the portion of the insulation layer exposed by the removal of the second layer thereby exposing the surface of the substrate to provide the active device regions, the remaining portion of the insulation layer comprising a field insulation layer; and F. removing the masking material from the field insulation layer; thereby providing a field implant in the substrate.

2. A method as defined in claim 1 wherein the active device regions are defined by the steps of:

A. depositing a layer of photoresist over the surface of the second layer, exposing the photoresist layer in a pattern defining the field regions and the active device regions and removing the portions of the photoresist layer in the field regions;

B. etching the second layer in the field regions not covered by photoresist layer to provide the recess in the second layer.

3. The method as defined in claim 2 wherein the etching step is a reactive ion etch.

4. The method as defined in claim 2 wherein the window-producing step provides windows in which the photoresist layer overhangs the second layer and the masking material deposition step comprises the steps of:

A. cold sputtering a layer of metal over the recess and the surface of the photoresist layer, the metal being deposited in a layer in the recess and covering the surface and sidewalls of the overhangs of the photoresist, with the metal on the photoresist being separated from the metal layer in the recess;

B. covering the surface of the chip with a second masking material to a depth sufficient to ensure that there is a depressions over the recess;

C. etching the layer of second masking material so as to expose the portion of the metal layer over the corner of the photoresist layer;

D. etching the exposed metal to expose the corner and overhang of the photo resist layer;

E. removing the photoresist layer, to thereby remove the second masking material and metal layers thereover; and F. removing the second masking layer over the metal layer in the recess.

5. The method as defined in claim 4 wherein the second masking material is photoresist so that the photoresist removing step and the second masking layer removing step occur together.

6. The method as defined in claim 1 wherein the second layer is polysilicon and the insulation layer is silicon dioxide and the substrate exposing step (E) comprises the steps of:

A. applying a mixture of niric acid, water and hydrofluoric acid to remove the remainder of the second layer; and B. applying a reactive ion etch to remove the exposed silicon dioxide.

7. A method as defined in claim 1 further comprising the steps of:

A. providing an active device in an active device region including a gate electrode having an upper surface at the level of the upper surface of the field insulation layer and further having side surfaces and further providing interconnects in the field regions;

B. providing a side surface insulation layer on the sidewalls of the gate electrode, the sidewall insulation layer and sidewalls of the field insulation layer defining windows; and C. depositing conductive material in the windows, the upper surfaces of the conductive material in the windows being at the level of the upper surface of the field insulation layer; whereby, when an insulation layer is applied to cover the chip as a support for interconnections among active devices and apertures are formed in the covering insulation layer to enable connections to be made between the interconnects and the active devices, the differences in depth of the apertures formed to the interconnects and apertures formed to the conductive material in the windows are reduced.

8. A method as defined in claim 7 further comprising the steps of covering the chip with said layer of insulation material.

9. A method as defined in claim 8 wherein the covering insulation layer is phospho-silicate glass.

10. A method as defined in claim 8 wherein the covering insulation layer is boro-phospho-silicate glass.

11. A method as defined in claim 7 wherein the active device providing step includes the steps of:

A. depositing a gate insulation layer over the active device regions;

B. forming gate electrodes on the gate insulation layer; and

C. using the field insulation layer and the gate electrodes as masks, implanting source and drain regions to form regions of a second conductivity type.

12. A method as defined in claim 7 wherein the side surface insulation layer providing step includes the steps of:

A. covering the chip with an insulation layer; and

B. etching the insulation layer sufficiently to expose the active device and field insulation layer.

13. A method as defined in claim 12 wherein the side surface insulation layer is silicon dioxide deposited using chemical vapor deposition.

14. A method as defined in claim 13 wherein the etching step is performed using a directional reactive ion etch.

15. A method as defined in claim 7 wherein the conductive material deposition step comprises the steps of:

A. depositing a layer of conductive material over the surface of the chip, the conductive material layer being substantially planar in the active device regions; and B. etching the conductive material sufficiently to expose the upper surface of the interconnects and the field insulation layer so as to leave conductive material in the recesses having upper surfaces at the level of the upper surfaces of the gate electrodes and the field insulation layer.

16. A method of fabricating an integrated circuit chip to provide a planar chip comprising the steps of:

A. providing source and drain regions and a gate electrode in active device regions defined by the field insulation layer, the gate electrode being insulated from the surface of the substrate by a gate insulation layer and having a top surface and side surfaces and height corresponding to the height of the field insulation layer;

B. providing an insulation layer along the side surfaces of the gate electrode to define a window defined by the field insulation layer and the insulation-covered side surfaces of the gate electrode; and C. depositing a conductive material in the window to the height of the field insulation and the gate electrode.

17. The method as defined in claim 16 further comprising the step of covering the surface of the chip with an insulation layer for supporting interconnections among active elements on the chip.

18. A method of forming a recess in an integrated circuit chip and filling it with a metal comprising the steps of:

A. depositing a layer of photoresist over the chip and removing the photoresist in a region in which the recess is to be formed;

B. forming a recess in the region of the chip defined by the removed photoresist such that the photoresist overhangs the recess;

C. cold sputtering a layer of metal over the recess and the surface of the photoresist layer, the metal being deposited in a layer in the recess and covering the top and sidewall of the photoresist, with the metal on the photoresist being separated from the metal layer in the recess;

D. covering the surface of the chip with a masking material to a depth sufficient to ensure that there is a depression over the recess;

E. etching the layer of masking material so as to expose the portion of a metal layer over a corner of the photoresist layer defined by the top surface and sidewall thereof;

F. etching the exposed metal to expose the top surface and sidewall of the photoresist layer in the area of the corner of the photoresist;

G. removing the photoresist layer, to thereby remove the masking material and metal layers thereover; and H. removing the masking layer over the metal layer in the recess.

19. The method as defined in claim 18 wherein the masking material is a second photoresist layer so that the photoresist removing step and the masking layer removing step occur together.

20. A method of forming an integrated circuit chip on a substrate of a first conductivity type comprising the steps of:

A. providing active devices in active device regions defined by openings in a field insulation layer, the gate electrodes of said active devices having upper surfaces and side surfaces, the upper surfaces of the gate electrodes of the active devices being at the level of the upper surface of the field insulation layer;

B. providing a side surface insulation layer on the side surface of the gate electrodes, the side surface insulation layer and the sidewalls of the field insulation layer defining windows; and C. depositing conductive material in the windows, the upper surfaces of the conductive material in the recesses being at the level of the upper surface of the field insulation layer.

21. A method as defined in claim 20 further comprising the step of covering the chip with a layer of insulation material.

22. A method as defined in claim 21 wherein the covering insulation layer is phospho-silicate glass.

23. A method as defined in claim 21 wherein the covering insulation layer is boro-phospho-silicate glass.

24. A method as defined in claim 20 wherein the active device providing step includes the steps of:

A. depositing a gate insulation layer over the active device regions;

B. forming gate electrodes on the gate insulation layer;

C. using the field insulation layer and the gate electrodes as masks, implanting source and drain regions to form regions of a second conductivity type; and D. using the field insulation layer and the gate electrodes as masks, removing the gate insulation layer in the source and drain regions, the gate insulation layer beneath the gate electrodes remaining.

25. A method as defined in claim 24 further comprising the step of providing source and drain power connections on the field insulation layer.

26. A method as defined in claim 20 wherein the side surface insulation layer providing step includes the steps of:

A. covering the chip with an insulation layer; and

B. etching the insulation layer sufficiently to expose the active device and field insulation layer.

27. A method as defined in claim 26 wherein the side surface insulation layer is silicon dioxide deposited using chemical vapor deposition.

28. A method as defined in claim 27 wherein the etching step is performed using a directional reactive ion etch.

29. A method as defined in claim 20 wherein the conductive material deposition step comprises the steps of:

A. depositing a layer of conductive material over the surface of the chip, the conductive material layer being substantially planar in the active device regions; and B. etching the conductive material so as to leave conductive material in the recesses such that the upper surfaces of the conductive material is at the level of the upper surfaces of the gate electrodes and the field insulation layer.

* * * * *